US011990949B2

(12) United States Patent
Escobar et al.

(10) Patent No.: US 11,990,949 B2
(45) Date of Patent: May 21, 2024

(54) RADIO FREQUENCY SIGNAL INTEGRITY VERIFICATION

(71) Applicant: International Business Machines Corporation, Armonk, NY (US)

(72) Inventors: Kevin Daniel Escobar, Rochester, MN (US); Layne A. Berge, Rochester, MN (US); George Paulik, Rochester, MN (US); George Russell Zettles, IV, Rochester, MN (US); Daniel Ramirez, Rochester, MN (US); Jarrett Betke, Hoffman Estates, IL (US); Karl Erickson, Rochester, MN (US); Timothy Clyde Buchholtz, Rochester, MN (US); Timothy Lindquist, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 64 days.

(21) Appl. No.: 17/817,834

(22) Filed: Aug. 5, 2022

(65) Prior Publication Data
US 2024/0048251 A1    Feb. 8, 2024

(51) Int. Cl.
*H04K 1/02*    (2006.01)
*H04B 17/10*    (2015.01)
(Continued)

(52) U.S. Cl.
CPC ........... *H04B 17/11* (2015.01); *H04B 17/101* (2015.01); *H04B 17/15* (2015.01)

(58) Field of Classification Search
CPC ...... H04B 17/11; H04B 17/15; H04B 17/101; H04B 17/13; H03G 3/3047; H03G 3/3068
(Continued)

(56) References Cited

U.S. PATENT DOCUMENTS 4,803,440 A * 2/1989 Hotta ................... H03G 3/3047
330/145
6,625,433 B1    9/2003 Poirier et al.
(Continued)

FOREIGN PATENT DOCUMENTS

CN    106571881 A    4/2017
CN    109375128 A    2/2019
(Continued)

OTHER PUBLICATIONS

International Search Report and Written Opinion received for PCT Application Serial No. PCT/IB2023/057634 dated Nov. 28, 2023, 13 pages.

*Primary Examiner* — Phuong Phu
(74) *Attorney, Agent, or Firm* — Amin, Turocy & Watson, LLP

(57) ABSTRACT

One or more systems, devices, and/or methods provided herein relate to a process for in-process radio frequency (RF) signal quality analysis and amplitude adjustment of one or more RF devices. In one or more embodiments, the RF device can comprise a portion of a quantum computing system, such as of readout electronics thereof, and thus amplitude adjustment can be at a waveform generator that generates pulses to affect one or more qubits of a quantum logic circuit of the quantum computing system. Generally, an electronic device can comprise an RF tap connected to an RF signal component of a first RF signal chain, and an analysis component connected to the RF tap, the analysis component configured to convert an RF signal from the RF signal component and to compare a conversion result thereof to an expected power output that is based on historical data for a second RF signal chain.

20 Claims, 10 Drawing Sheets

(51) Int. Cl.
*H04B 17/11* (2015.01)
*H04B 17/15* (2015.01)
*H04L 25/03* (2006.01)
*H04L 25/49* (2006.01)

(58) Field of Classification Search
USPC ............... 375/267, 299, 347, 296, 297, 345
See application file for complete search history.

(56) References Cited

U.S. PATENT DOCUMENTS

| | | | |
|---|---|---|---|
| 7,035,750 B2 | 4/2006 | de Obaldia et al. | |
| 7,463,704 B1 * | 12/2008 | Tehrani | H03G 3/3068 375/267 |
| 8,705,595 B2 | 4/2014 | Bailey et al. | |
| 8,731,857 B2 | 5/2014 | Hillman, Jr. | |
| 9,046,565 B2 | 6/2015 | Collins, III et al. | |
| 9,236,836 B2 | 1/2016 | Fernandez | |
| 9,964,586 B2 | 5/2018 | Kuo et al. | |
| 10,057,795 B2 | 8/2018 | Starzer et al. | |
| 10,097,287 B1 | 10/2018 | Sheat et al. | |
| 10,643,962 B1 | 5/2020 | Ichitsubo et al. | |
| 2012/0264378 A1 * | 10/2012 | Steele | H04B 17/13 455/73 |
| 2014/0187170 A1 | 7/2014 | Forstner | |
| 2020/0394524 A1 | 12/2020 | Vainsencher et al. | |
| 2022/0019927 A1 | 1/2022 | Lauer | |

FOREIGN PATENT DOCUMENTS

| | | |
|---|---|---|
| CN | 110275060 A | 9/2019 |
| CN | 212463159 U | 2/2021 |
| EP | 3 843 018 A1 | 6/2021 |
| WO | 2022/094660 A1 | 5/2022 |

* cited by examiner

RADIO FREQUENCY SIGNAL INTEGRITY VERIFICATION

TECHNICAL FIELD

The present disclosure relates to radio frequency signal integrity verification, and more particularly to dynamic RF signal integrity verification, such as during use of an RF signal chain outputting the RF signal.

BACKGROUND

In radio frequency electronic systems, it can be challenging to diagnose manufacturing, assembly and/or component failure issues due to the downtime that is associated with such diagnosis.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatuses and/or computer program products can provide a process to dynamically calibrate one or more components of a radio frequency (RF) signal chain based on dynamic diagnosing of the RF signal chain during use of the RF signal chain.

In accordance with an embodiment, an electronic device can comprise an RF tap connected to an RF signal component of a first RF signal chain, and an analysis component connected to the RF tap, the analysis component configured to convert an RF signal from the RF signal component and to compare a conversion result thereof to an expected power output that is based on historical data for a second RF signal chain.

An advantage of the aforementioned electronic device can generally be real time diagnostic capabilities of RF electronics of a system.

In accordance with another embodiment, a method of radio frequency diagnostics can comprise obtaining, by a system operatively coupled to a processor, a radio frequency (RF) signal of a first RF signal chain, converting, by the system, the RF signal to a conversion result, and comparing, by the system, the conversion result to an expected power output that is based on historical data for a second RF signal chain.

An advantage of the aforementioned method can generally be real time diagnostic capabilities of RF electronics of a system.

In accordance with still another embodiment, a computer program product facilitating a process to diagnose one or more radio frequency components, the computer program product comprising a computer readable storage medium having program instructions embodied therewith, the program instructions executable by a processor to cause the processor to obtain, by the processor, a radio frequency (RF) signal of a first RF signal chain, convert, by the processor, the RF signal to a conversion result, and compare, by the processor, the conversion result to an expected power output that is based on historical data for a second RF signal chain.

An advantage of the aforementioned computer program product can generally be real time diagnostic capabilities of RF electronics of a system.

Another advantage of one or more embodiments described herein can be employment of the one or more embodiments described herein at or coupled to a quantum computing system having one or more qubits of a quantum logic circuit that are coupled to the RF electronics being diagnosed by the one or more embodiments described herein.

Another advantage of the aforementioned device, system, computer program product and/or method can generally be time and cost savings for analysis, detection, and/or amplification adjustment of RF electronics of a system. That is system reliability can be increased by quickly and efficiently identifying and correcting manufacturing and/or assembly defects in such RF electronics. Downtime can be reduced by use of the one or more embodiments described herein, which can be employed in-process, such as in real time, during functioning of the RF electronics to provide diagnosis including the analysis, detection and/or amplitude adjustment. Indeed, by at least partially automating the diagnosis, improvements can be achieved across various geographical and/or language barriers.

Another advantage of the one or more embodiments described herein can be use of existing electronics, such as a power detector and analog-to-digital convertor. A local oscillator and/or embedded sensors at the RF electronics is not employed by the one or more embodiments described herein.

The one or more innovations, frameworks, systems, devices, computer program products and/or methods described herein can be additionally, and/or alternatively described as follows:

An electronic device can comprise a radio frequency (RF) tap connected to an RF signal component of a first RF signal chain, and an analysis component connected to the RF tap, wherein the analysis component is configured to convert an RF signal from the RF signal component and to compare a conversion result of the conversion to an expected power output that is based on historical data for a second RF signal chain.

In accordance with the electronic device, the analysis component can comprise a power detector and an analog-to-digital converter, wherein, optionally, the power detector can be configured to output a DC voltage based on the RF signal, and wherein, optionally, the analog—to digital converter can be configured to convert the DC voltage to a power represented by a binary signal.

The electronic device of any previous paragraph of this section further can comprise a determination component that is configured to identify a variation in the conversion result as compared to the historical data, or to identify a failed component in the first RF signal chain based on the historical data.

The electronic device of any previous paragraph of this section further can comprise a determination component that is configured to generate an alert upon determining that the conversion result meets or crosses a specified power threshold.

The electronic device of any previous paragraph of this section further can comprise an amplitude calibration component that, based on the comparison between the historical data and the conversion result, calibrates an amplitude of a signal input to a quantum logic circuit comprising one or more qubits.

The electronic device of any previous paragraph of this section further can comprise a plurality of RF taps, including the RF tap, connected to the analysis component, wherein, optionally, the RF taps of the plurality of RF taps can be separately connected to different respective loads.

The electronic device of any previous paragraph of this section further can be fabricated absent a local oscillator in the electronic device between and including the RF tap and the analysis component.

In accordance with the electronic device of any previous paragraph of this section, the analysis component can be configured to generate a power map, based on the historical data, and wherein, optionally, the power map can comprise a range of additional conversion results defining non-failed component output including the expected power output.

A method of radio frequency diagnostics can comprise obtaining, by a system operatively coupled to a processor, a radio frequency (RF) signal of a first RF signal chain, converting, by the system, the RF signal to a conversion result, and comparing, by the system, the conversion result to an expected power output that is based on historical data for a second RF signal chain.

The method further can comprise outputting, by the system, a DC voltage based on the RF signal, and, optionally, converting, by the system, the DC voltage to power represented by a binary number.

The method of any previous paragraph of this section further can comprise identifying, by the system, a variation in the conversion result as compared to the historical data, or, alternatively, identifying, by the system, a failed component in the first RF signal chain based on the historical data.

The method of any previous paragraph of this section further can comprise generating, by the system, an alert upon determining that the conversion result meets or crosses a specified power threshold.

The method of any previous paragraph of this section further can comprise calibrating, by the system, and based on the comparison between the historical data and the conversion result, an amplitude of a signal input to a quantum logic circuit comprising one or more qubits.

The method of any previous paragraph of this section further can comprise generating, by the system, a power map, based on the historical data, wherein, optionally, the power map can comprise a range of additional conversion results defining non-failed component output including the expected power output.

A computer program product, for facilitating a process to diagnose one or more radio frequency components, can comprise a computer readable storage medium having program instructions embodied therewith. The program instructions can be executable by a processor to cause the processor to obtain, by the processor, a radio frequency (RF) signal of a first RF signal chain, convert, by the processor, the RF signal to a conversion result, and compare, by the processor, the conversion result to an expected power output that is based on historical data for a second RF signal chain.

In accordance with the computer program product, the program instructions can be executable by the processor to cause the processor to output, by the processor, a DC voltage based on the RF signal, and, optionally, convert, by the processor, the DC voltage to power represented by a binary number.

In accordance with the computer program product of any previous paragraph of this section, the program instructions can be executable by the processor to cause the processor to identify, by the processor, a variation in the conversion result as compared to the historical data, or, alternatively, to identify, by the processor, a failed component in the first RF signal chain based on the historical data.

In accordance with the computer program product of any previous paragraph of this section, the program instructions can be executable by the processor to cause the processor to generate, by the processor, an alert upon determining that the conversion result meets or crosses a specified power threshold.

In accordance with the computer program product of any previous paragraph of this section, the program instructions can be executable by the processor to cause the processor to calibrate, by the processor, based on the comparison between the historical data and the conversion result, an amplitude of a signal input to a quantum logic circuit comprising one or more qubits.

In accordance with the computer program product of any previous paragraph of this section, the program instructions can be executable by the processor to cause the processor to generate, by the processor, a power map, based on the historical data, wherein, optionally, the power map can comprise a range of additional conversion results defining non-failed component output including the expected power output.

DETAILED DESCRIPTION

Figure 1:
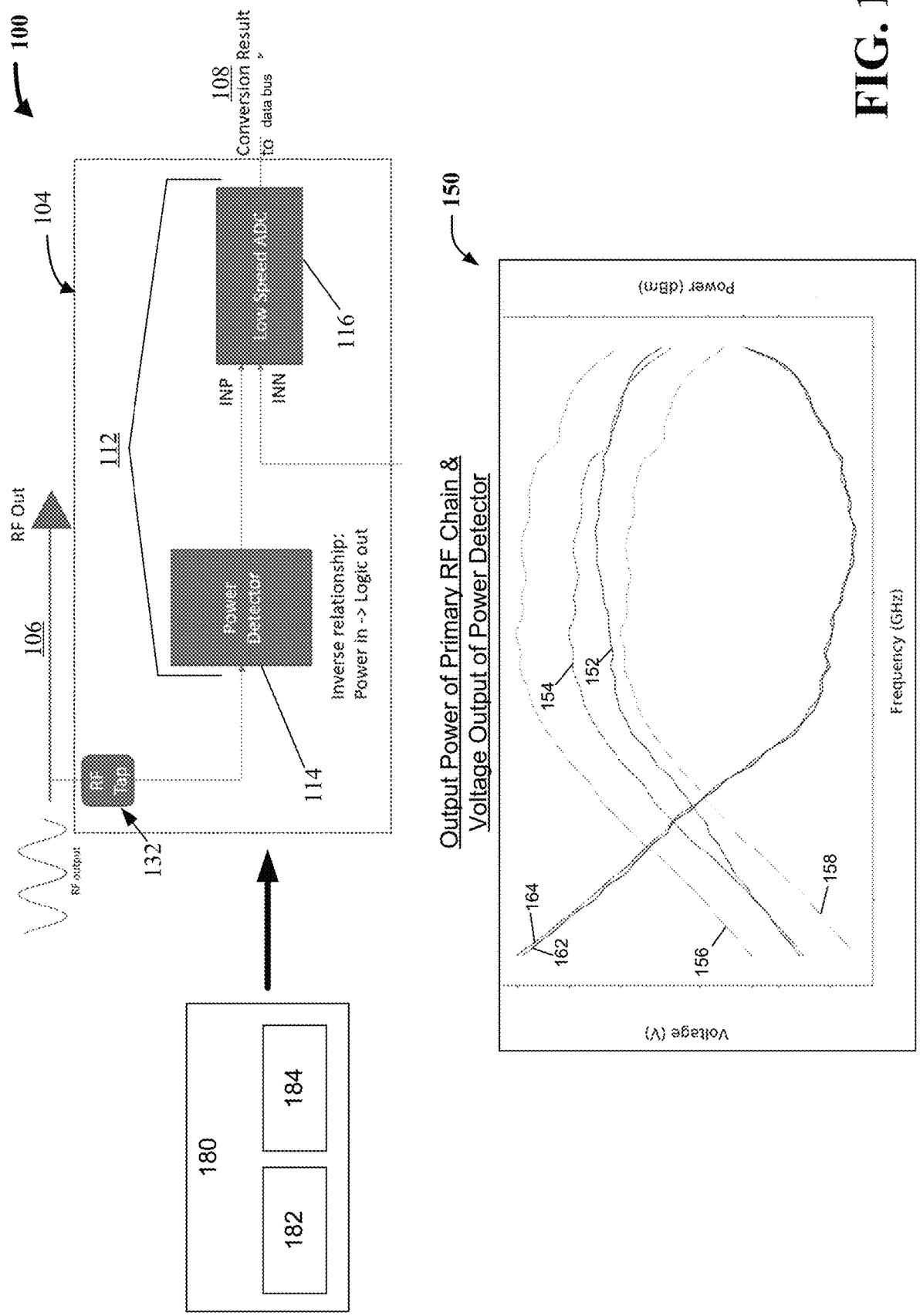
FIG. 1 illustrates a schematic view of a system and a corresponding graph, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

In conventional RF signal chain diagnostics, a test signal can be compared against a device under test, such as using fast Fourier transform calculations and a local oscillator. To accomplish these diagnostics, the RF signal chain is taken offline. Embedded sensors and/or other special equipment can be employed. Real time or dynamic diagnostics are not able to be facilitated.

To address these one or more deficiencies, one or more embodiments are now described with reference to the drawings, where like referenced numerals are used to refer to like elements throughout.

As used herein, the terms "entity", "requesting entity", and "user entity" can refer to a machine, device, component, hardware, software, smart device and/or human.

As used herein, "coupler", "coupler element", and "coupling element" can be interchangeable.

As used herein, the term "cost" can refer to money, power, memory, bandwidth, time, manpower and/or the like.

In the following description, for purposes of explanation, numerous specific details are set forth in order to provide a more thorough understanding of the one or more embodiments. It is evident, however, in various cases, that the one or more embodiments can be practiced without these specific details.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting systems of FIGS. 1-4, can further comprise, be associated with, and/or be coupled to one or more computer and/or computing-based elements described herein with reference to an operating environment, such as the operating environment 900 illustrated at FIG. 9. In one or more described embodiments, computer and/or computing-based elements can be used in connection with implementing one or more of the systems, devices, components and/or computer-implemented operations shown and/or described in connection with FIGS. 1-4 and/or with other figures described herein.

Turning first generally to FIG. 1, one or more embodiments described herein can include one or more devices, systems and/or apparatuses that can provide a process to execute one or more radio frequency (RF) diagnostics relative to one or more loads of one or more RF devices. At FIG. 1, illustrated is a block diagram of an example, non-limiting system 100 that can provide such diagnostic processes, in accordance with one or more embodiments described herein.

Generally, the non-limiting system 100 can be used as a runtime diagnostic and/or a manufacturing test. In an example, a transmit RF card can have a RF tap that feeds a power detector. The power detector can output a direct current (DC) voltage depending on the power level the power detector sees at the input. The output from the power detector can connect to a low-speed analog-to-digital converter (ADC) that can convert the input voltage to a binary number that can be read, such as over a data bus. The data bus can comprise a serial interface, such as a serial peripheral interface. The input voltage to the ADC can then be converted to power through a matrix of equations and compared against an ideal RF output. An envelope for pass fail distribution can be created to characterize hardware at issue or failing hardware. The output distribution can be used to calibrate amplitudes.

That is, the non-limiting system 100 can comprise a radio frequency (RF) diagnostic system 104 that can comprise a radio frequency (RF) tap 132 connected to an RF signal component of a first RF signal chain. The RF diagnostic system 104 further can comprise an analysis component 112 that can be configured to convert an RF signal 106 from the RF signal component and to compare a conversion result 108 of the conversion to an expected power output. The expected power output can be based on historical data for an RF signal chain, such as on historical data for a second RF signal chain, different from the first RF signal chain.

In one or more embodiments, the analysis component 112 can comprise a power detector 114 and an analog-to-digital converter (ADC) 116, such as a low speed ADC. The power detector 114 can be configured to output a DC voltage based on the RF signal 106. The power detector 114 can have an inverse relationship associated therewith, such that higher power to the input of the power detector 114 can produce lower voltage at the output of the power detector 114.

The ADC 116 can be configured to convert the DC voltage to a power, such as represented by a binary signal. In one or more embodiments, the ADC 116 can use a differential input, such as $V_{in}$=INP−INN, where INP is the non-inverting input and INN is the inverting input.

A local oscillator (LO) is not employed in the RF diagnostic system 104 in the analysis component 112 and/or between the RF tap 132 and the analysis component 112. Likewise, embedded sensors are not employed at the RF device/RF signal component/RF signal chain from which the RF signal 106 is obtained.

In one or more embodiments, an entity 180 can perform one or more operations to manufacture an electronic device and/or system that is in accordance with one or more embodiments described herein. For example, an entity 180, such as a manufacturing system, can comprise a controller and/or processor 182. The processor 182 can issue one or more instructions to cause manufacture of the electronic device and/or system. For example, the entity 180 further can comprise one or more nodes 184, such as manufacturing devices, that can be controlled by the controller 182 to manufacture the electronic device and/or system. In an example, a node 184 can be controlled to couple components together, and/or the like.

In one or more embodiments, the entity 180, and/or another manufacturing entity, can perform one or more operations (e.g., manufacturing operations) corresponding to one or more other electronic devices and/or systems described herein.

Figure 2:
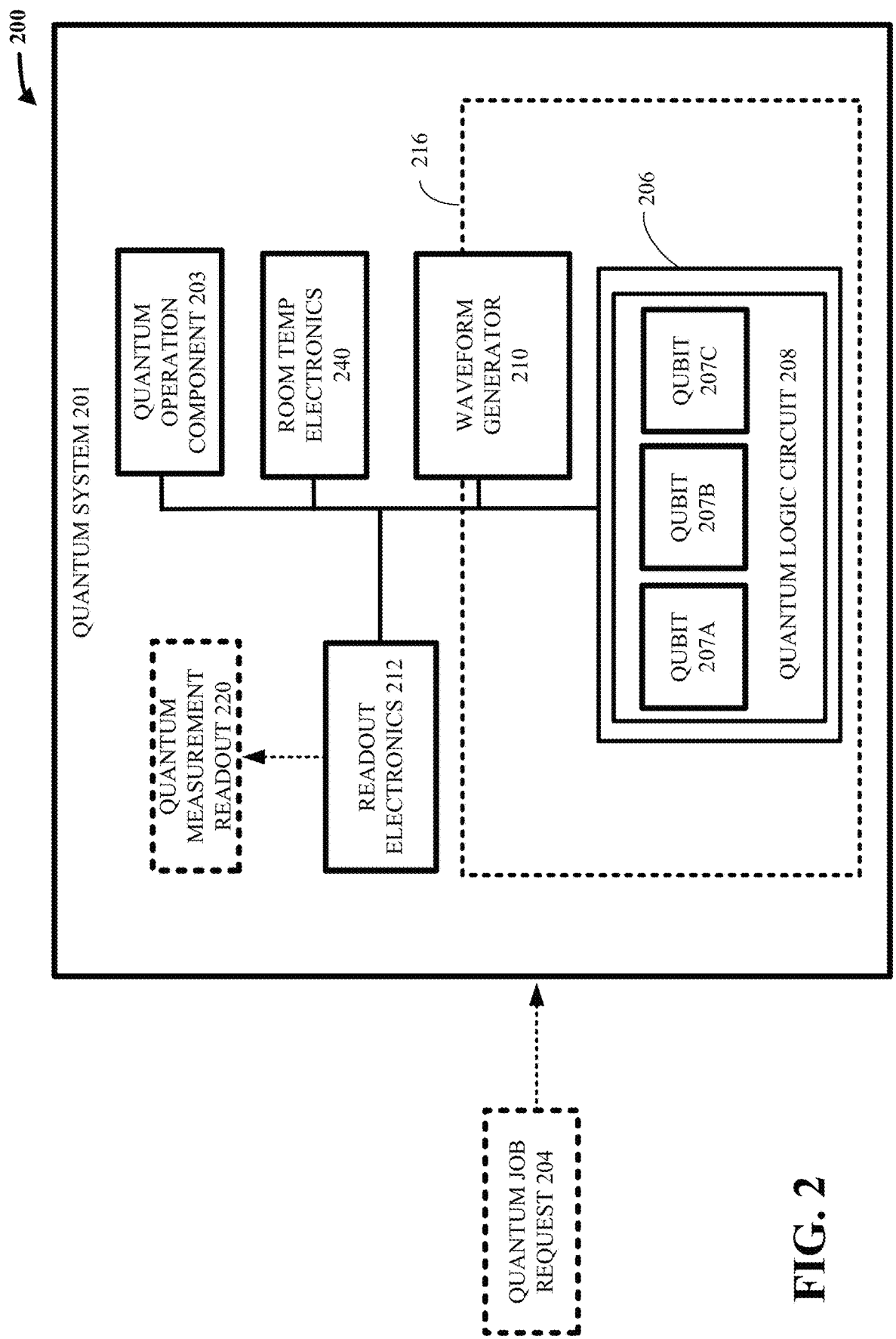
FIG. 2 illustrates a schematic view of another system, in accordance with one or more embodiments described herein.

Referring still to FIG. 1, illustrated is a graph 150 demonstrating the diagnostic processes of the non-limiting system 100, whether or not associated with a quantum system and/or readout electronics. Particularly, graph 150 illustrates an inverse relationship between power and voltage cause by a power detector, such as the power detector 114. The power plotted at line 152 is the RF output power of the first (primary) RF signal chain. There is a central dotted line 154 illustrating "ideal" output power and bounding upper and lower dotted lines 156 and 158 that provide pass/fail bounds. The voltage plotted at line 162 is the voltage output of the power detector (e.g., power detector 114), which is subsequently input to a respective ADC (e.g., ADC 116). A dotted line 164 illustrates an "ideal" voltage output. Turning next generally to FIG. 2, one or more embodiments of devices/ systems for RF diagnosis described herein can be employed at a quantum system. This can include as at least a portion of a quantum processor or room temperature control electronics, and/or coupled thereto. In one or more embodiments, such electronic device described herein can be comprised by readout electronics of a quantum system. In an example, signals generated from room temperature electronics of a quantum system are precise to manipulate qubit states. Solving for one or more deficiencies of conventional RF diagnostic frameworks, the electronic device(s) described herein can allow for realtime, dynamic, and/or or in-process diagnostics of RF components of a quantum system, thus allowing for adjustment of the signals generated.

Referring directly to FIG. 2, one or more embodiments described herein can include one or more devices, systems and/or apparatuses that can provide a process to execute one or more quantum operations, such as perform one or more quantum gates. At FIG. 2, illustrated is a block diagram of an example, non-limiting system 200 that can provide such probing process, in accordance with one or more embodiments described herein. While referring here to one or more processes, facilitations and/or uses of the non-limiting system 200, description provided herein, both above and below, also can be relevant to one or more other non-limiting systems described herein, such as the devices/systems of FIGS. 1, 3 and/or 4, to be described below in detail.

The following/aforementioned description(s) refer(s) to the operation of a single quantum program from a single quantum job request. This operation can include one or more readouts from cryogenic environment electronics within cryogenic chamber 216 by room temperature control/readout electronics 212 external to the cryogenic chamber 216. That is, one or more of the processes described herein can be scalable, also such as including additionally, and/or alternatively, execution of one or more quantum programs and/or quantum job requests in parallel with one another.

In one or more embodiments, the non-limiting system 200 can be a hybrid system and thus can include both one or more classical systems, such as a quantum program implementation system, and one or more quantum systems, such as the quantum system 201. In one or more other embodiments, the quantum system 201 can be separate from, but function in combination with, a classical system.

In such case, one or more communications between one or more components of the non-limiting system 200 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an advanced and adaptive network technology (ANT), an ultra-wideband (UWB) standard protocol and/or other proprietary and/or non-proprietary communication protocols.

In one or more other embodiments, the classical system can provide a quantum job request 204, qubit mapping, quantum circuit to be executed and/or the like. Such classical system can analyze the one or more quantum measurement readouts 220. Further, such classical system can manage a queueing of quantum circuits to be operated on the one or more qubits of the quantum logic circuit of a respective quantum system 201.

Figure 8:
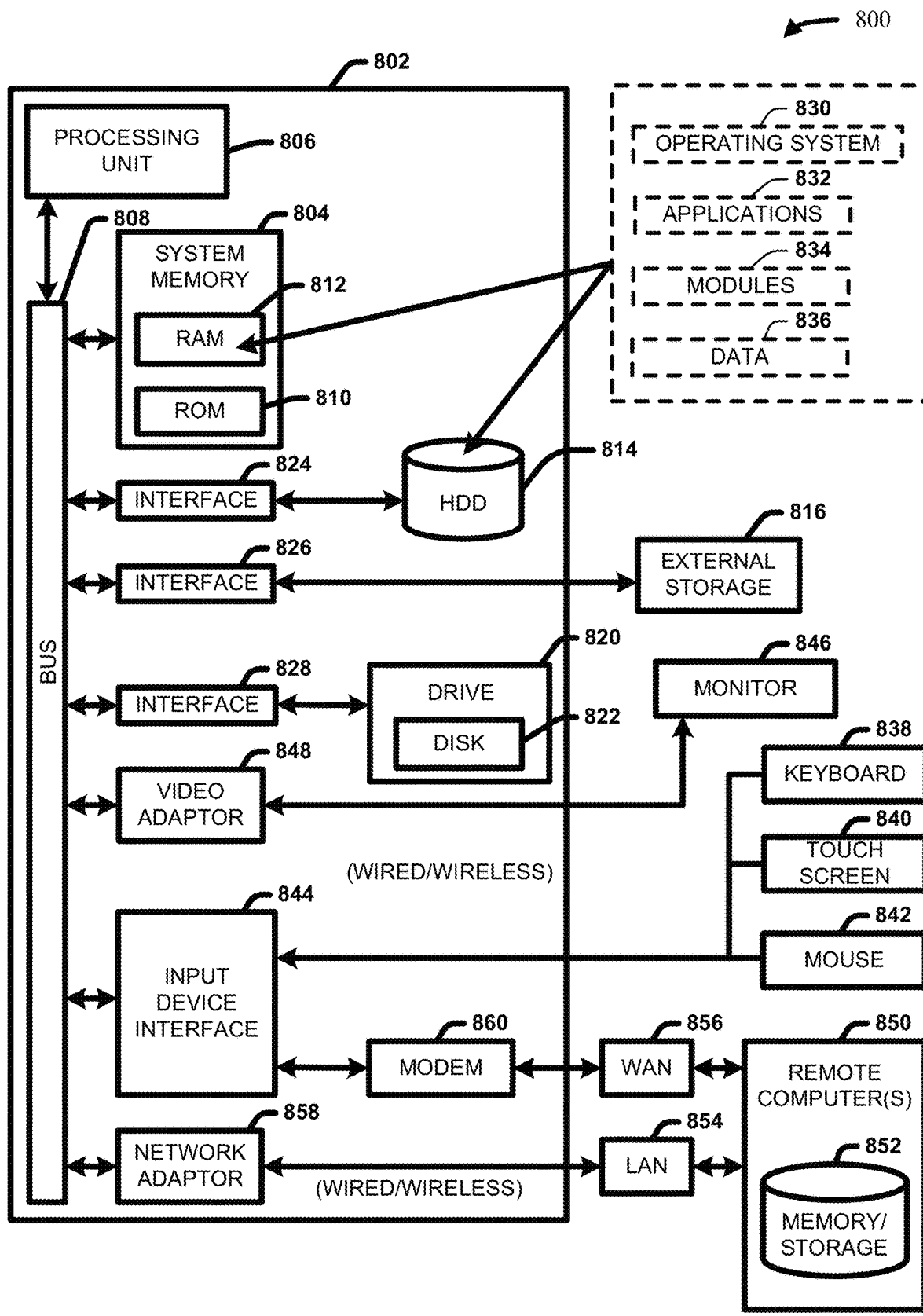
FIG. 8 illustrates a block diagram of an example, non-limiting, operating environment in which one or more embodiments described herein can be provided.

For example, in one or more embodiments, the non-limiting systems described herein, such as non-limiting system 200 as illustrated at FIG. 2, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIG. 2 and/or with other figures described herein.

The quantum system 201 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 220, can be responsive to the quantum job request 204 and associated input data and can be based at least in part on the input data, quantum functions and/or quantum computations.

In one or more embodiments, the quantum system 201 can comprise one or more quantum components, such as a quantum operation component 203, a quantum processor 206, quantum readout/control electronics 212, a waveform generator 210, additional room temp. electronics 240, and/or a quantum logic circuit 208 comprising one or more qubits (e.g., qubits 207A, 207B and/or 207C), also referred to herein as qubit devices 207A, 207B and 207C.

The quantum processor 206 can be any suitable processor. The quantum processor 206 can generate one or more instructions for controlling the one or more processes of the quantum logic circuit 208 and/or waveform generator 210.

The quantum operation component 203 can obtain (e.g., download, receive, search for and/or the like) a quantum job request 204 requesting execution of one or more quantum programs. The quantum operation component 203 can determine one or more quantum logic circuits, such as the quantum logic circuit 208, for executing the quantum program. The request 204 can be provided in any suitable format, such as a text format, binary format and/or another suitable format. In one or more embodiments, the request 204 can be received by a component other than a component of the quantum system 201, such as a by a component of a classical system coupled to and/or in communication with the quantum system 201.

The waveform generator 210 can perform one or more waveform operations for operating and/or affecting one or more quantum circuits on the one or more qubits 207A, 207B and/or 207C. For example, the waveform generator 210 can operate one or more qubit effectors, such as qubit oscillators, harmonic oscillators, pulse generators and/or the like to cause one or more pulses to stimulate and/or manipulate the state(s) of the one or more qubits 207A, 207B and/or 207C comprised by the quantum system 201.

The waveform generator 210, such as in combination with the quantum processor 206, can execute operation of a quantum logic circuit on one or more qubits of the circuit (e.g., qubit 207A, 207B and/or 207C). In response, the quantum operation component 203 can output one or more quantum job results, such as one or more quantum measurements 220, in response to the quantum job request 204.

The quantum logic circuit 208 and a portion or all of the waveform generator 210 and/or quantum processor 206 can be contained in a cryogenic environment, such as generated by a cryogenic chamber 216, such as a dilution refrigerator. Indeed, a signal can be generated by the waveform generator 210 to affect the one or more qubits 207A-C. Where qubits 207A, 207B and 207C are superconducting qubits, cryogenic temperatures, such as about 4 Kelvin (K) or lower can be employed to facilitate function of these physical qubits. Accordingly, the elements of the waveform generator 210 also are to be constructed to perform at such cryogenic temperatures.

Figure 3:
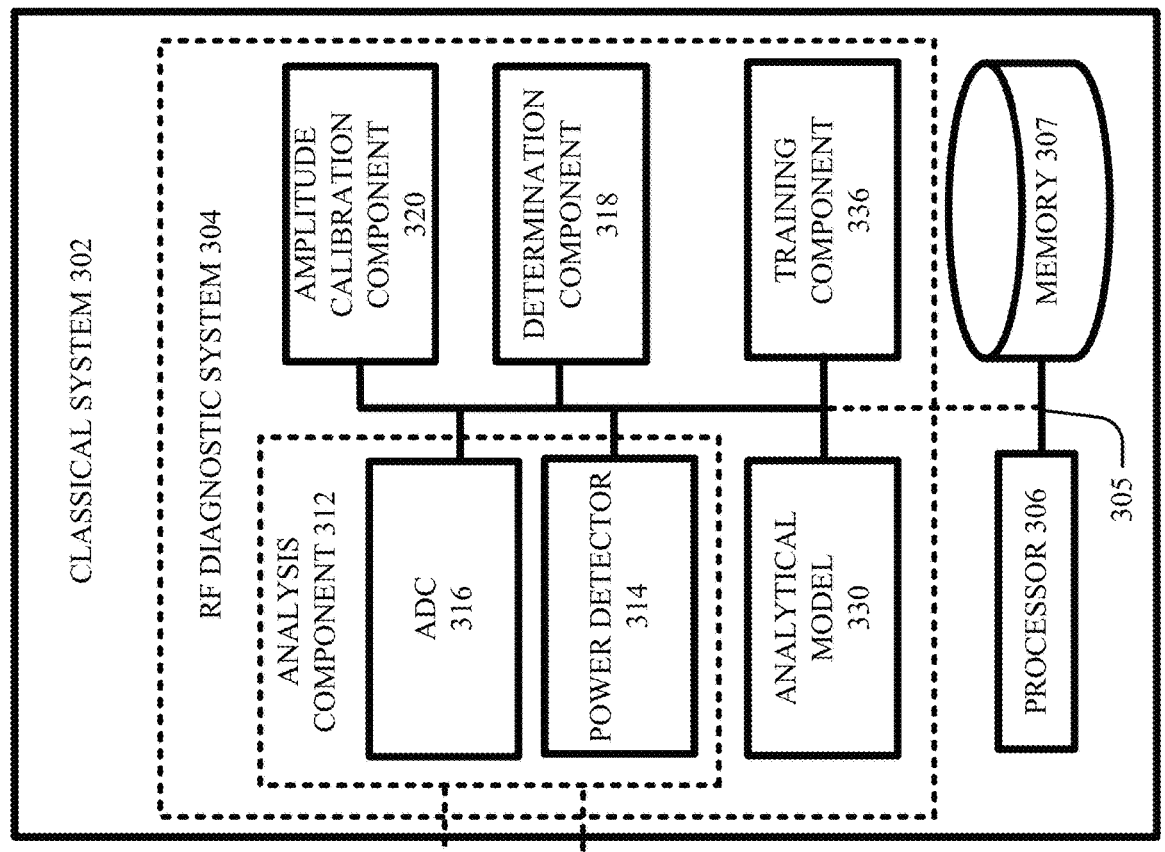
FIG. 3 illustrates yet another system, in accordance with one or more embodiments described herein.
Figure 4:
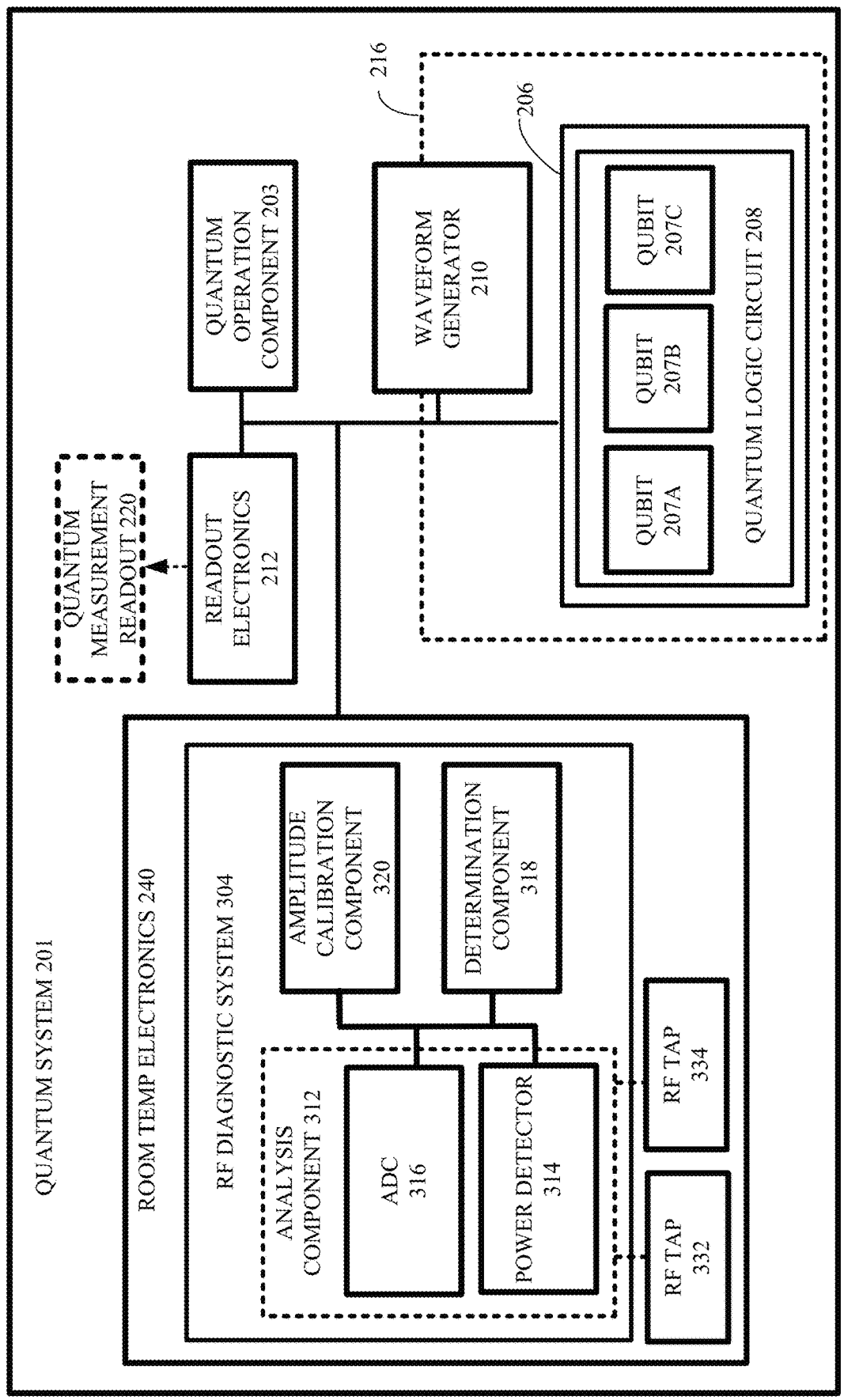
FIG. 4 illustrates still another system, in accordance with one or more embodiments described herein.

Turning now to additional FIGS. 3 and 4, varying embodiments of devices/systems than can be employed with the quantum system 201 are described herein.

For example, FIG. 3 illustrates an RF diagnostic system 304 that is at least partially comprised by a classical system 302 that can function in cooperation with the quantum system 201. The RF diagnostic system 304 can be coupled to one or more RF taps, such as of room temperature readout electronics 212 of the quantum system 201, also herein referred to as a quantum computing system 201. It is noted that the non-limiting system 300 can stand on its own, separate from any connection, implied, direct or otherwise, to the aspects of FIG. 2.

At FIG. 3, illustrated is a schematic view of a non-limiting system 300 comprising both the quantum system 201 of FIG. 2 and a classical system 302. An RF diagnostic system 307 can be at least partially comprised by the classical system 302, and can function with a processor 306/memory 307 of the classical system 302. The RF diagnostic system 307, such as the analysis component 312, can obtain RF signals from one or more RF taps (e.g., 332 and/or 334) coupled to one or more RF components of one or more RF signal chains of the quantum system 201. The RF taps 332 and/or 334 can be disposed in a room temperature environment and/or in a cryogenic environment, such as provided by the cryogenic chamber 216.

One or more communications between one or more components of the non-limiting system 300, and/or between an external system and the non-limiting system 300, can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an advanced network technology (ANT), an ultra-wideband (UWB) standard protocol and/or other proprietary and/or non-proprietary communication protocols.

Description of the quantum system 201 is not repeated here for sake of brevity.

Turning to the classical system 302, comprised by the classical system 302 can be any suitable type of component, machine, device, facility, apparatus and/or instrument that comprises a processor and/or can be capable of effective and/or operative communication with a wired and/or wireless network. All such embodiments are envisioned. For example, the classical system 302 can comprise a server device, computing device, general-purpose computer, special-purpose computer, quantum computing device (e.g., a quantum computer), tablet computing device, handheld device, server class computing machine and/or database, laptop computer, notebook computer, desktop computer, cell phone, smart phone, consumer appliance and/or instrumentation, industrial and/or commercial device, digital assistant, multimedia Internet enabled phone, multimedia players and/or another type of device and/or computing device. Likewise, the classical system 302 can be disposed and/or run at any suitable device, such as, but not limited to a server device, computing device, general-purpose computer, special-purpose computer, quantum computing device (e.g., a quantum computer), tablet computing device, handheld device, server class computing machine and/or database, laptop computer, notebook computer, desktop computer, cell phone, smart phone, consumer appliance and/or instrumentation, industrial and/or commercial device, digital assistant, multimedia Internet enabled phone, multimedia players and/or another type of device and/or computing device.

The classical system 302 can be associated with, such as accessible via, a cloud computing environment. For example, the classical system 302 can be associated with a cloud computing environment 950 described below with reference to FIG. 9 and/or with one or more functional abstraction layers described below with reference to FIG. 10 (e.g., hardware and software layer 1060, virtualization layer 1070, management layer 1080 and/or workloads layer 1090).

The classical system 302 can comprise a plurality of components. The components can include a memory 307, processor 306, bus 305 and RF diagnostic system 304. In one or more embodiments, the RF diagnostic system 304 can comprise the processor 306 and/or memory 307, and/or a different processor and/or memory. The RF diagnostic system 304 can comprise an analysis component 312, amplitude calibration component 320 and/or determination component 318. The analysis component 312 can comprise an analog-to-digital converter (ADC) 316 and a power detector 314. In one or more embodiments, the RF diagnostic system 304 can comprise an analytical model 330 and/or a training component 336.

Discussion now turns to the processor 306, memory 307 and bus 305 of the code encryption and decryption system 202.

For example, in one or more embodiments, classical system 302 can comprise a processor 306 (e.g., computer processing unit, microprocessor, classical processor, quantum processor and/or like processor). In one or more embodiments, a component associated with classical system 302, as described herein with or without reference to the one or more figures of the one or more embodiments, can comprise one or more computer and/or machine readable, writable and/or executable components and/or instructions that can be executed by processor 306 to facilitate performance of one or more processes defined by such component(s) and/or instruction(s). In one or more embodiments, the processor 306 can comprise one or more of the analysis component 312, amplitude calibration component 320, determination component 318, analytical model 330 and/or training component 336.

In one or more embodiments, the classical system 302 can comprise a computer-readable memory 307 that can be operably connected to the processor 306. The memory 307 can store computer-executable instructions that, upon execution by the processor 306, can cause the processor 306 and/or one or more other components of the classical system 302 (e.g., one or more of the analysis component 312, amplitude calibration component 320, determination component 318, analytical model 330 and/or training component 336) to perform one or more actions. In one or more embodiments, the memory 307 can store computer-executable components (e.g., one or more of the analysis component 312, amplitude calibration component 320, determination component 318, analytical model 330 and/or training component 336).

Classical system 302 and/or a component thereof as described herein, can be communicatively, electrically, operatively, optically and/or otherwise coupled to one another via a bus 305 to perform functions of non-limiting system 300, classical system 302 and/or one or more components thereof and/or coupled therewith. Bus 305 can comprise one or more of a memory bus, memory controller, peripheral bus, external bus, local bus, quantum bus and/or another type of bus that can employ one or more bus architectures. One or more of these examples of bus 305 can be employed to implement one or more embodiments described herein.

In one or more embodiments, classical system 302 can be coupled (e.g., communicatively, electrically, operatively, optically and/or like function) to one or more external systems (e.g., a non-illustrated electrical output production system, one or more output targets, an output target controller and/or the like), sources and/or devices (e.g., classical and/or quantum computing devices, communication devices and/or like devices), such as via a network. In one or more embodiments, one or more of the components of the non-limiting system 300 can reside in the cloud, and/or can reside locally in a local computing environment (e.g., at a specified location(s)).

In addition to the processor 306 and/or memory 307 described above, classical system 302 can comprise one or more computer and/or machine readable, writable and/or executable components and/or instructions that, when executed by processor 306, can facilitate performance of one or more operations defined by such component(s) and/or instruction(s).

Turning now to the RF diagnostic system 304, the analysis component 312, and/or a component thereof, can be coupled to the RF tap, wherein the analysis component 312 can be configured to convert an RF signal from the RF signal component and to compare a conversion result of the conversion to an expected power output. The expected power output can be based on historical data for the RF signal chain from which the RF signal was output, or from a second RF signal chain.

For example, the analysis component can comprise a power detector 314 and an analog-to-digital converter 316. The power detector 314 can be configured to output a DC voltage based on the RF signal obtained. The analog-to-digital converter (ADC) 316 can be configured to convert the DC voltage to a power, such as represented by a binary signal. For example, the ADC 316 can convert the output voltage from the power detector to a binary signal representing that voltage. The voltage can be interpreted as a power based on the power seen at the power detector 314.

Once the voltage is digitized, a power map and/or other post processing can be employed to convert the converted voltage raw data to power.

A power map can be generated using empirical lab data and/or actual historical data, such as by the analysis component 312. For example, a power map can be generated by sweeping the primary RF signal chain through a known frequency range and capturing the output using the secondary RF tap containing the power detector and ADC. Post processing can be used to create the power map plot based on the raw data from the ADC. The post processing can take empirical data and/or historical data and map the voltage to a power based on the frequency. Different frequencies can supply power levels.

The power map can comprise a range of additional conversion results defining non-failed component output including the expected power output. In one or more embodiments, the power map can be employed to visually identify the primary RF signal chain output power at different frequencies.

The determination component 318 can be configured to identify a variation in the conversion result as compared to the historical data, or to identify a failed component in the first RF signal chain based on the historical data. For example, variation of the conversion result from the historical data can indicate component failure. Specific variations can indicate different components in the RF signal chain. For example, particular failure signatures can relate to particular components, such as based on comparison to empirical and/or historical data.

In one or more embodiments, the determination component 318 can employ the power map to identify the variation. For example, the determination component 318 can identify one or more contexts of empirical data/historical data at the power map that have been identified as triggers and/or as leading to such variation.

The determination component 318 can be configured to generate an alert upon comparison of the conversion result to a specified power threshold, and subsequent determining that the conversion result meets or crosses the specified power threshold.

In one or more embodiments, the power threshold, particular historical data employed, and/or expected power output can be at least partially determined by an analytical model 330.

The analytical model 330 can be, can comprise and/or can be comprised by a classical model, such as a predictive model, neural network, and/or artificial intelligent model. An artificial intelligent model and/or neural network (e.g., a convolutional network and/or deep neural network) can comprise and/or employ artificial intelligence (AI), machine learning (ML), and/or deep learning (DL), where the learning can be supervised, semi-supervised and/or unsupervised.

For example, the analytical model 330 can comprise an ML model trained on previous and/or expected RF diagnostic data of one or more RF signal chains. Relative to comparison of the conversion result against historical data, the analytical model 330 can determine historical data from/representing an RF signal chain having similar aspects to the RF signal chain from which the RF signal being diagnosed was obtained. Such aspects can include one or more of frequency response, roll-off, output power, ripple, hardware design, and/or hardware vendor, without being limited thereto.

Relative to comparison of the conversion result to a specified power threshold, the analytical model 330 can determine a power threshold previously employed with an RF signal chain having similar aspects to the RF signal chain from which the RF signal being diagnosed was obtained. Relative to determination of an expected power output for comparison to the conversion result, the analytical model 330 can employ one or more knowledge bases and/or other information databases having default or expected values.

Generally, the analytical model 330 can be trained, such as by the training component 336, on a set of training data that can represent the type of data for which the system will be used. Checks of the analytical model 330, such as relative to variation determination, can be performed periodically and/or at any other frequency for deterioration. Re-training of the analytical model 330 can be performed employing up-to-date data collected from RF diagnostic measurements over a specified time window. For example, the training component 336 can train the analytical model 330 upon determination of a variation or failed component, or determination of a new variation not yet trained upon by the analytical model 330.

Next, an amplitude calibration component 320 can, based on the comparison between the historical data and the conversion result, calibrate, and/or request calibration of, an amplitude of a signal input to a quantum logic circuit comprising one or more qubits. For example, the amplitude calibration component 320 can determine if the primary RF signal chain requires more or less power to give the proper amplitude for calibration.

In one or more embodiments, a plurality of RF taps, including the RF tap, can be each connected to the analysis component, wherein each RF tap of the plurality of RF taps is separately connected to a different respective load.

Further, the non-limiting system 300 can be employed absent a local oscillator in the electronic device between and including the RF tap and the analysis component 312.

For another example, FIG. 4 illustrates the RF diagnostic system 304 at least partially included in room temperature electronics of readout electronics 212 of the quantum system 201. In another example, turning to the non-limiting system 400 of FIG. 4, the RF diagnostic system 304 can be at least partially comprised by readout electronics 212 of a quantum system, such as the quantum system 201.

Figure 5:
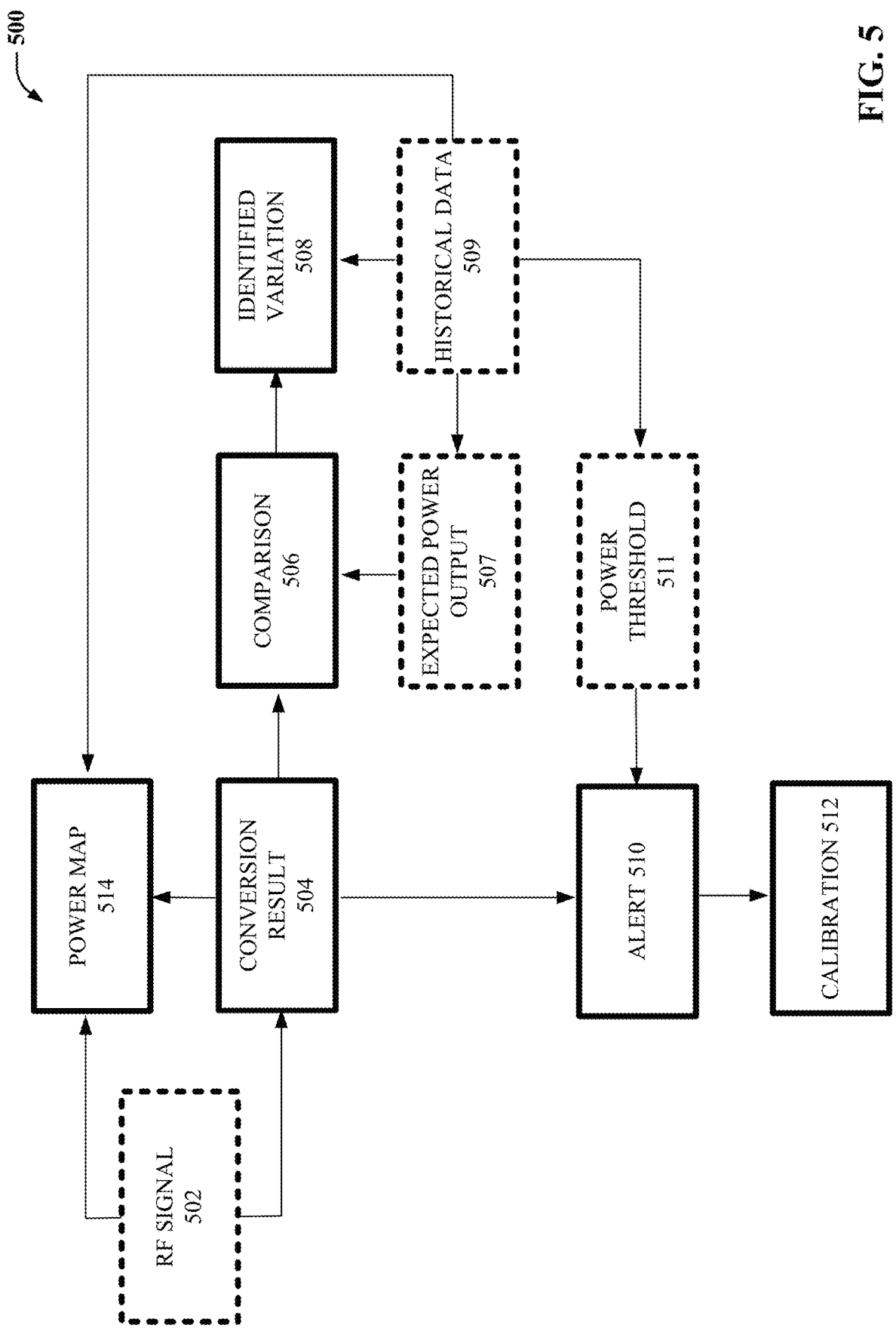
FIG. 5 illustrates a block diagram of one or more processes that can be performed by a system/electronic device described herein.

Turning next to FIG. 5, and also still referring to FIG. 4, illustrated is a process flow of one or more operations that can be performed by the RF diagnostic system 304, whether or not associated with a quantum system and/or readout electronics.

As illustrated, an RF signal 502 can be obtained, such as via an RF tap 332 via the analysis component 312. Using the RF signal 502, a conversion result 504 can be output comprising a conversion of the RF signal 502, such as via the analysis component 312. As noted above, the conversion result can comprise a DC voltage converted to power represented by a binary number. A comparison 506 can be performed of the conversion result 504 relative to an expected power output 507, such as by the determination component 318. In one or more embodiments, the expected power output 507 can be based on historical data 509 for an RF signal chain other than the RF signal chain from which the RF signal 502 was obtained.

A variation 508 can be identified based on historical data 509. The variation 508 can comprise a variation in the conversion result 504 and/or a failed component in the RF signal chain from which the RF signal 502 was obtained.

An alert 510 can be generated, such as upon determining, by the determination component 318, that the conversion result 504 meets or crosses a specified power threshold 511. In one or more embodiments, the power threshold 511 can be determined based on the historical data 509.

In response to the alert 510 and/or the identified variation 508, a calibration 512 can be performed of an amplitude of a signal that is to be employed with the RF signal chain, such as input to a quantum log circuit comprising one or more qubits, in the case of a quantum computer or system comprising the RF signal chain.

In one or more embodiments, a power map 514 can be generated, such as by the analysis component 312, such as based on the historical data 509.

Figure 6:
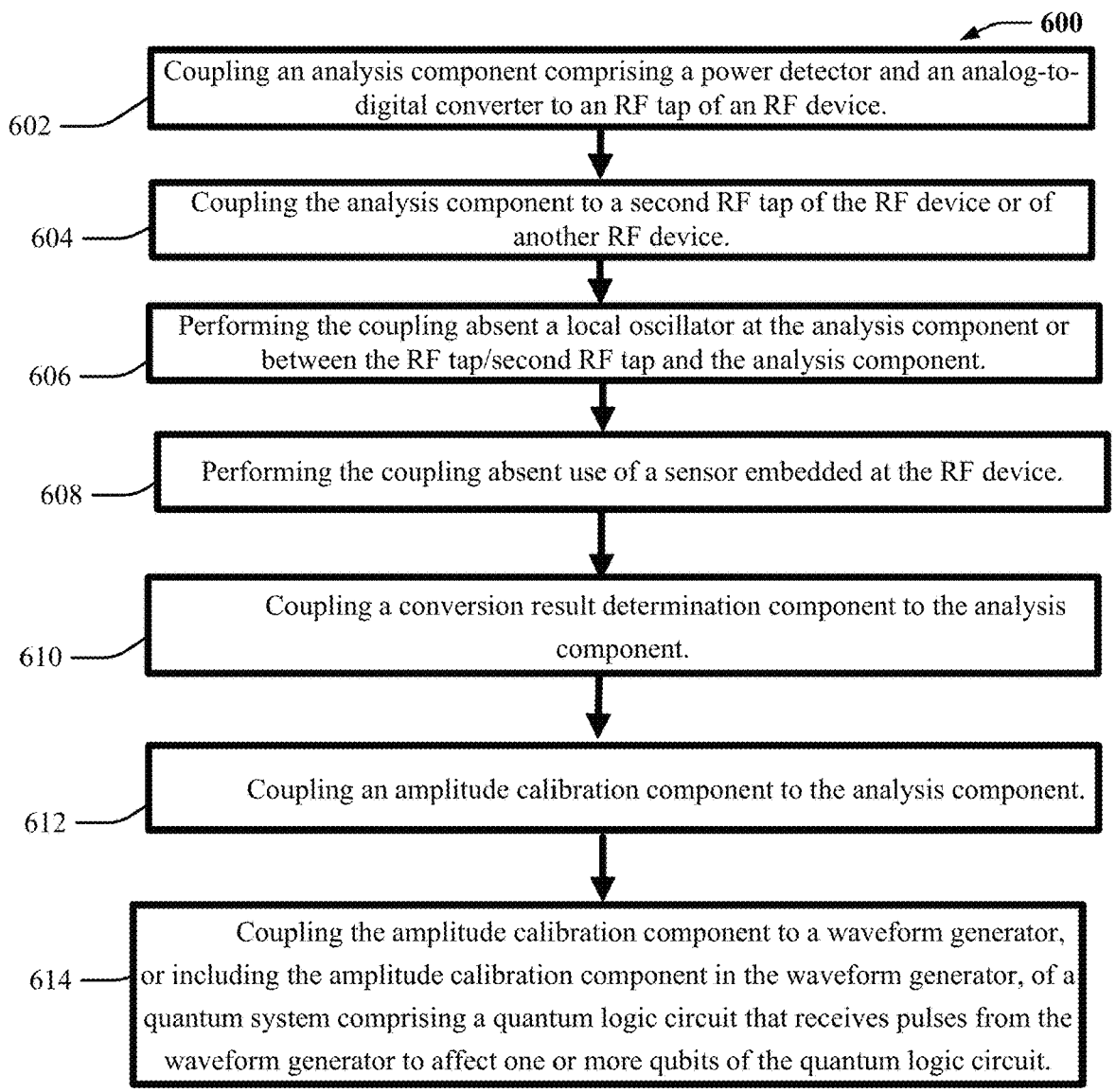
FIG. 6 illustrates a process flow for a method of manufacture of a device/system in accordance with one or more embodiments described herein.

Next, FIG. 6 illustrates a flow diagram of an example, non-limiting method 600 that can provide a process to at least partially construct an electronic device in accordance with one or more embodiments described herein, such as the non-limiting devices of FIGS. 1-4. Repetitive description of like elements and/or processes employed in respective embodiments is omitted for sake of brevity.

At 602, the non-limiting method 600 can comprise coupling (e.g., by entity 180) an analysis component comprising a power detector and an analog-to-digital converter to an RF tap of an RF device.

At 604, the non-limiting method 600 can comprise coupling (e.g., by entity 180) the analysis component comprising a power detector and an analog-to-digital converter to a second RF tap of the RF device or of another RF device.

At 606, the non-limiting method 600 can comprise performing the coupling (e.g., by entity 180) absent a local oscillator at the analysis component or between the RF tap/second RF tap and the analysis component.

At 608, the non-limiting method 600 can comprise performing the coupling (e.g., by entity 180) absent use of a sensor embedded at the RF device.

At 610, the non-limiting method 600 can comprise coupling (e.g., by entity 180) a conversion result determination component to the analysis component.

At 612, the non-limiting method 600 can comprise coupling (e.g., by entity 180) an amplitude calibration component to the analysis component.

At 614, the non-limiting method 600 can comprise coupling (e.g., by entity 180) the amplitude calibration component to a waveform generator, or including the amplitude calibration component in the waveform generator, of a quantum system comprising a quantum logic circuit that receives pulses from the waveform generator to affect one or more qubits of the quantum logic circuit.

Figure 7:
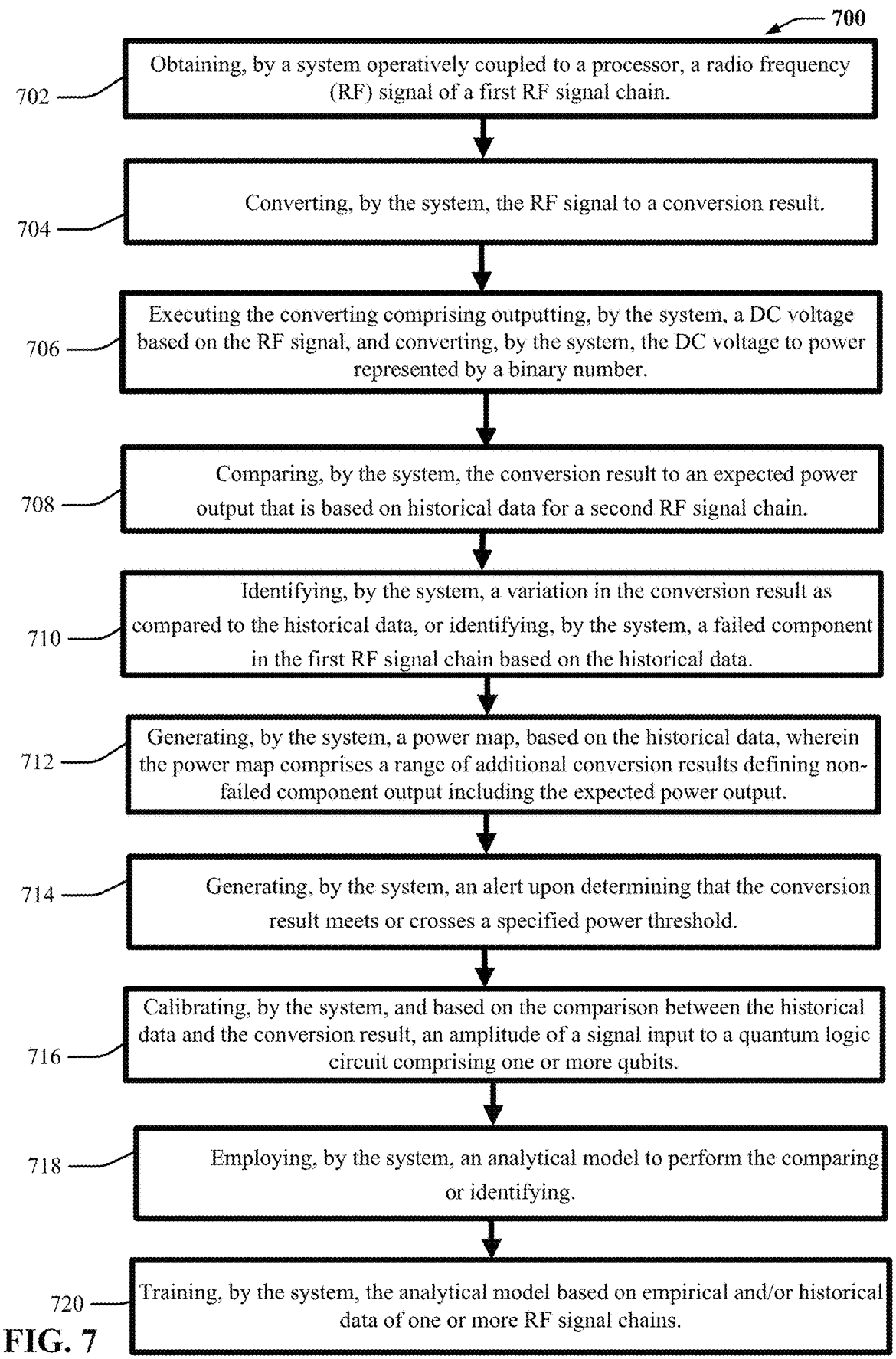
FIG. 7 illustrates a process flow for a method of use of a device/system in accordance with one or more embodiments described herein.

Next, FIG. 7 illustrates a flow diagram of an example, non-limiting method 700 that can provide a process to at least partially use an electronic device in accordance with one or more embodiments described herein, such as the non-limiting devices of FIGS. 1-4. Repetitive description of like elements and/or processes employed in respective embodiments is omitted for sake of brevity.

At 702, the non-limiting method 700 can comprise obtaining, by a system operatively coupled to a processor (e.g., analysis component 312), a radio frequency (RF) signal of a first RF signal chain.

At 704, the non-limiting method 700 can comprise converting, by the system (e.g., analysis component 312), the RF signal to a conversion result.

At 706, the non-limiting method 700 can comprise executing the converting comprising outputting, by the system (e.g., power detector 114), a DC voltage based on the RF signal, and converting, by the system (e.g., ADC 316), the DC voltage to power represented by a binary number.

At 708, the non-limiting method 700 can comprise comparing, by the system (e.g., determination component 318), the conversion result to an expected power output that is based on historical data for a second RF signal chain.

At 710, the non-limiting method 700 can comprise identifying, by the system (e.g., determination component 318), a variation in the conversion result as compared to the historical data, or identifying, by the system, a failed component in the first RF signal chain based on the historical data.

At 712, the non-limiting method 700 can comprise generating, by the system (e.g., analysis component 312), a power map, based on the historical data, wherein the power map comprises a range of additional conversion results defining non-failed component output including the expected power output.

At 714, the non-limiting method 700 can comprise generating, by the system (e.g., determination component 318), an alert upon determining that the conversion result meets or crosses a specified power threshold.

At 716, the non-limiting method 700 can comprise calibrating, by the system (e.g., amplitude calibration component 320), and, based on the comparison between the historical data and the conversion result, an amplitude of a signal input to a quantum logic circuit comprising one or more qubits.

At 718, the non-limiting method 700 can comprise employing, by the system (e.g., determination component 318), an analytical model (e.g., analytical model 330) to perform the comparing or identifying.

At 720, the non-limiting method 700 can comprise training, by the system (e.g., training component 336), the analytical model (e.g., analytical model 330) based on empirical and/or historical data of one or more RF signal chains.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

In summary, one or more systems, electronic devices, and/or methods provided herein relate to a process for in-process radio frequency (RF) signal quality analysis and amplitude adjustment of one or more RF devices. In one or more embodiments, the RF device can comprise a portion of a quantum computing system, such as of readout electronics thereof, and thus amplitude adjustment can be at a waveform generator that generates pulses to affect one or more qubits of a quantum logic circuit of the quantum computing system. Generally, an electronic device can comprise an RF tap connected to an RF signal component of a first RF signal chain, and an analysis component connected to the RF tap, the analysis component configured to convert an RF signal from the RF signal component and to compare a conversion result thereof to an expected power output that is based on historical data for a second RF signal chain.

An advantage of the aforementioned electronic device, system, computer program product and/or method can generally be real time diagnostic capabilities of RF electronics of a system.

Another advantage of one or more embodiments described herein can be employment of the one or more embodiments described herein at or coupled to a quantum computing system having one or more qubits of a quantum logic circuit that are coupled to the RF electronics being diagnosed by the one or more embodiments described herein.

Another advantage of the aforementioned electronic device, system, computer program product and/or method can generally be time and cost savings for analysis, detection, and/or amplification adjustment of RF electronics of a system. That is system reliability can be increased by quickly and efficiently identifying and correcting manufacturing and/or assembly defects in such RF electronics. Downtime can be reduced by use of the one or more embodiments described herein, which can be employed in-process, such as in real time, during functioning of the RF electronics to provide diagnosis including the analysis, detection and/or amplitude adjustment. Indeed, by at least partially automating the diagnosis, improvements can be achieved across various geographical and/or language barriers.

Another advantage of the one or more embodiments described herein can be use of existing electronics, such as a power detector and analog-to-digital convertor. A local oscillator and/or embedded sensors at the RF electronics is not employed by the one or more embodiments described herein.

In view of the one or more embodiments described herein, a practical application of the devices described herein can be ability to diagnose an RF component during use of the RF signal chain comprising the RF component, as compared to first shutting down the RF signal chain prior to diagnosing the RF component. Such is a useful and practical application of computers, thus facilitating faster, automatic, and/or more efficient diagnosis of RF signal chains. Overall, such computerized tools can constitute a concrete and tangible technical improvement in the field of RF electronics.

Another practical application of the devices described herein can be ability to adjust generation of a signal to affect a qubit in response to the RF diagnosis. Such is a useful and practical application of computers, thus facilitating enhanced (e.g., improved and/or optimized) operation of the employed qubits, such as within a quantum logic circuit having high numbers of qubits, such as about 1000 qubits or more. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function in connection with an RF signal chain or with a quantum system that can receive as input a quantum job request and can measure a real-world qubit state of one or more qubits, such as superconducting qubits, of the quantum system. For example, relative to a quantum system, one or more frameworks described herein can obtain RF signals from one or more RF taps of the quantum system.

Moreover, a device and/or method described herein can be implemented in one or more domains to enable scaled RF diagnostics. Indeed, use of a device as described herein can be scalable, such as where plural RF signals from one or more RF signal chains are diagnosed at least partially at a same time as one another.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to RF diagnostics, as compared to existing systems and/or techniques. Systems, computer-implemented methods and/or computer program products facilitating performance of these processes are of great utility in the field of RF electronics, quantum computing and/or superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively obtain, analyze and/or convert an RF signal as the one or more embodiments described herein can facilitate this process. And, neither can the human mind nor a human with pen and paper perform one or more of these processes, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 9:
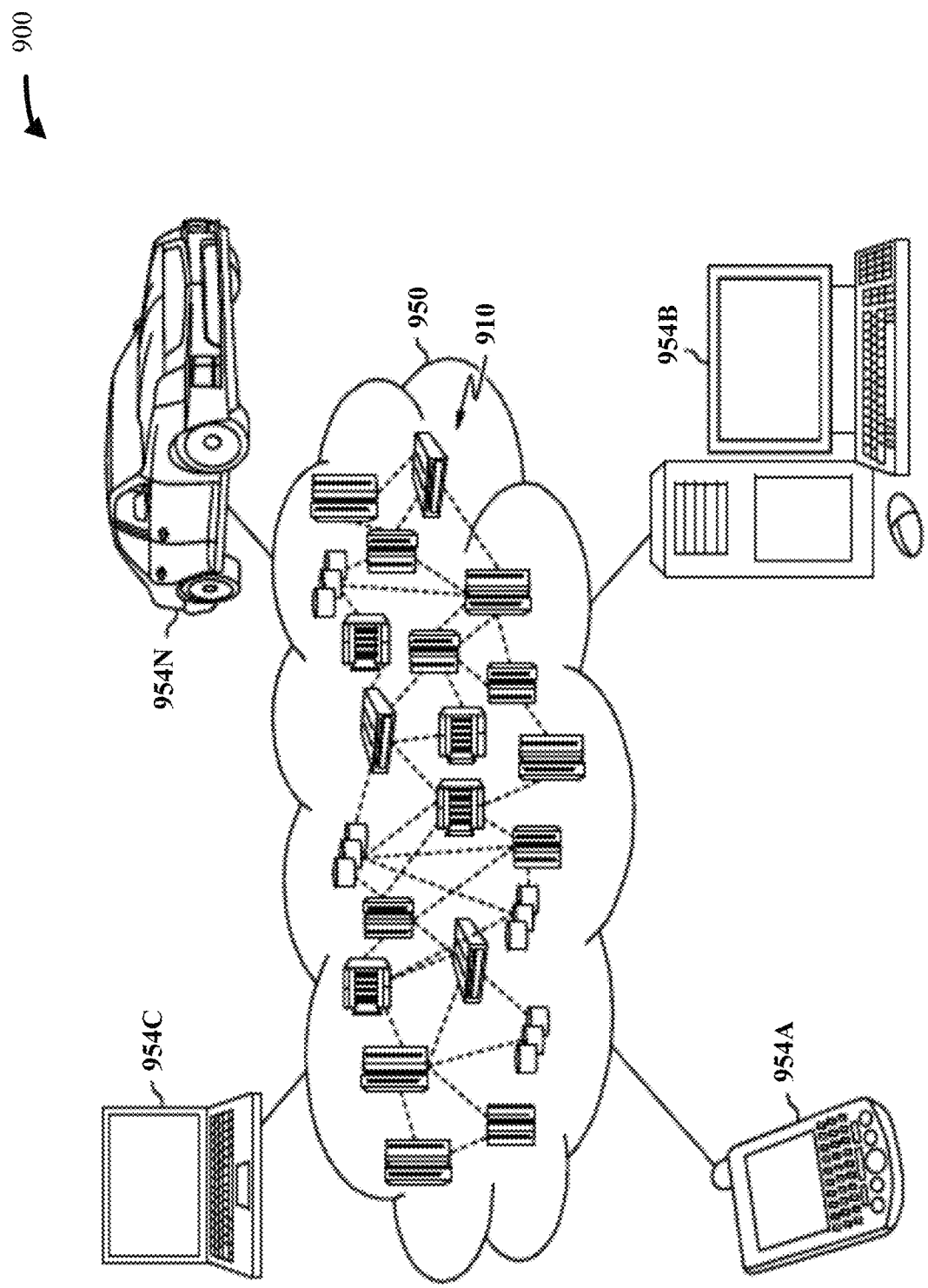
FIG. 9 illustrates a block diagram of an example, non-limiting, cloud computing environment in accordance with one or more embodiments described herein.
Figure 10:
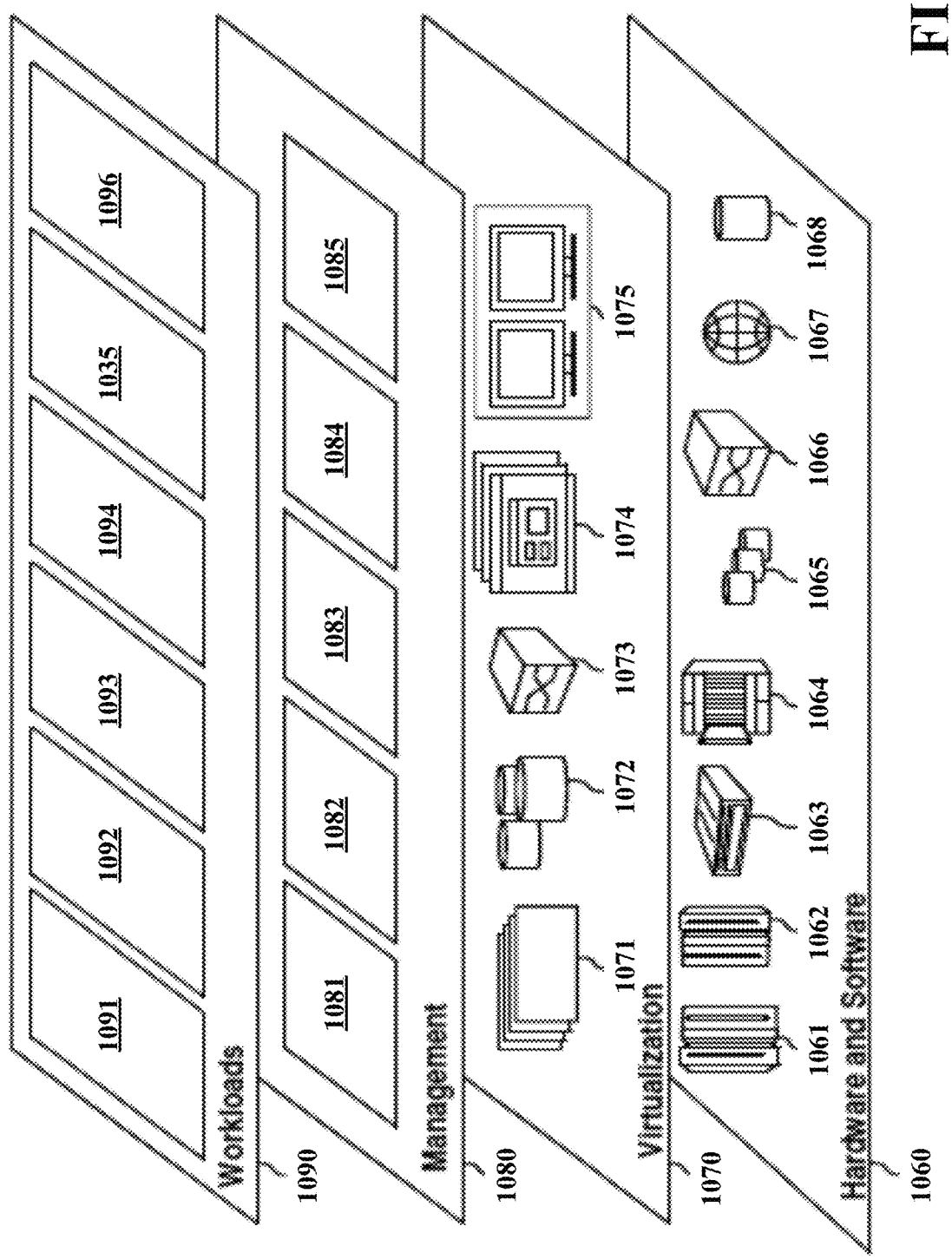
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 which can be comprised by, be associated with and/or be coupled to one or more computer and/or computing-based elements described herein with reference to any one or more of FIGS. 1-4. For example, such suitable operating environment 800 can, in one or more embodiments, obtain and/or transmit a quantum job request (e.g., quantum job request 204) to the quantum system 201, manage a quantum job queue, and/or manage one or more classical operations in conjunction with the quantum system 201. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 8, the example operating environment 800 can comprise a computer 802, the computer 802 including a processing unit 806, a system memory 804 and/or a system bus 808.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction(s). For example, memory 804 can store computer and/or machine readable, writable and/or executable components and/or instructions that, when executed by processing unit 806, can facilitate execution of the one or more functions described herein relating to non-limiting system 100, 200, 300 and/or 400, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid-state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid-state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to the illustration 900 of FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100, 200, 300 and/or 400 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 9). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1035; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules.

Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. One or more, if not all aspects of the one or more embodiments described herein can be practiced on stand-alone computers. In a distributed computing environment, program modules can be located in local and/or remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and/or techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim. The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. An electronic device comprising:
a radio frequency (RF) tap connected to an RF signal component of a first RF signal chain, wherein the first RF signal chain comprises a plurality of hardware components; and
an analysis component connected to the RF tap, wherein the analysis component is configured to convert an RF signal from the RF signal component and to compare a conversion result of the conversion to a power output data structure that is based on historical data for a second RF signal chain having a configuration that matches the first RF signal chain, wherein the power output data structure maps power output variations from an expected power output to respective failures of components of the plurality of hardware components.

2. The electronic device of claim 1, wherein the analysis component comprises a power detector and an analog-to-digital converter, wherein the power detector is configured to output a DC voltage based on the RF signal, and wherein the analog—to digital converter is configured to convert the DC voltage to a power represented by a binary signal.

3. The electronic device of claim 1, further comprising:
a determination component that is configured to identify a variation in the conversion result from the expected power output, or to identify a failed component of the plurality of hardware components in the first RF signal chain based on the power output data structure.

4. The electronic device of claim 1, further comprising:
a determination component that is configured to generate an alert upon determining that the conversion result meets or crosses a specified power threshold.

5. The electronic device of claim 1, further comprising:
an amplitude calibration component that, based on the comparison, calibrates an amplitude of a signal input to a quantum logic circuit comprising one or more qubits.

6. The electronic device of claim 1, further comprising:
a plurality of RF taps, including the RF tap, connected to the analysis component, wherein the RF taps of the plurality of RF taps are separately connected to different respective loads.

7. The electronic device of claim 1, absent a local oscillator in the electronic device between and including the RF tap and the analysis component.

8. The electronic device of claim 1, wherein the analysis component is configured to generate the power output data structure, based on the historical data, and wherein the power output data structure comprises a range of additional conversion results defining non-failed component output including the expected power output.

9. A method of radio frequency diagnostics, the method comprising:
obtaining, by a system operatively coupled to a processor, a radio frequency (RF) signal of a first RF signal chain, wherein the first RF signal chain comprises a plurality of hardware components;
converting, by the system, the RF signal to a conversion result; and
comparing, by the system, the conversion result to a power output data structure that is based on historical data for a second RF signal chain having a configuration that matches the first RF signal chain, wherein the power output data structure maps power output variations from an expected power output to respective failures of components of the plurality of hardware components.

10. The method of claim 9, further comprising:
outputting, by the system, a DC voltage based on the RF signal; and
converting, by the system, the DC voltage to power represented by a binary number.

11. The method of claim 9, further comprising:
identifying, by the system, a variation in the conversion result from the expected power output; or
identifying, by the system, a failed component of the plurality of hardware components in the first RF signal chain based on the power output data structure.

12. The method of claim 9, further comprising:
generating, by the system, an alert upon determining that the conversion result meets or crosses a specified power threshold.

13. The method of claim 9, further comprising:
calibrating, by the system, and based on the comparing, an amplitude of a signal input to a quantum logic circuit comprising one or more qubits.

14. The method of claim 9, further comprising:
generating, by the system, the power output data structure, based on the historical data, and wherein the power output data structure comprises a range of additional conversion results defining non-failed component output including the expected power output.

15. A computer program product facilitating a process to diagnose one or more radio frequency components, the computer program product comprising a computer readable storage medium having program instructions embodied therewith, the program instructions executable by a processor to cause the processor to:
obtain, by the processor, a radio frequency (RF) signal of a first RF signal chain, wherein the first RF signal chain comprises a plurality of hardware components;
convert, by the processor, the RF signal to a conversion result; and
compare, by the processor, the conversion result to a power output data structure that is based on historical data for a second RF signal chain having a configuration that matches the first RF signal chain, wherein the power output data structure maps power output variations from an expected power output to respective failures of components of the plurality of hardware components.

16. The computer program product of claim 15, wherein the program instructions are executable by the processor to cause the processor to:
output, by the processor, a DC voltage based on the RF signal; and
convert, by the processor, the DC voltage to power represented by a binary number.

17. The computer program product of claim 15, wherein the program instructions are executable by the processor to cause the processor to:
- identify, by the processor, a variation in the conversion result from the expected power output; or
- identify, by the processor, a failed component of the plurality of hardware components in the first RF signal chain based on the power output data structure.

18. The computer program product of claim 15, wherein the program instructions are executable by the processor to cause the processor to:
- generate, by the processor, an alert upon determining that the conversion result meets or crosses a specified power threshold.

19. The computer program product of claim 15, wherein the program instructions are executable by the processor to cause the processor to:
- calibrate, by the processor, based on the comparison, an amplitude of a signal input to a quantum logic circuit comprising one or more qubits.

20. The computer program product of claim 15, wherein the program instructions are executable by the processor to cause the processor to:
- generate, by the processor, the power output data structure, based on the historical data, and wherein the power output data structure comprises a range of additional conversion results defining non-failed component output including the expected power output.

\* \* \* \* \*